(12) United States Patent
Oh

(10) Patent No.: US 7,310,009 B2
(45) Date of Patent: Dec. 18, 2007

(54) PHASE LOCKED LOOP CIRCUIT HAVING DEADLOCK PROTECTION CIRCUIT AND METHODS OF OPERATING SAME

(75) Inventor: Jung-hoon Oh, Seoul (KR)

(73) Assignee: Samsung Electronics Co., Ltd (KR)

( * ) Notice: Subject to any disclaimer, the term of this patent is extended or adjusted under 35 U.S.C. 154(b) by 40 days.

(21) Appl. No.: 11/291,415

(22) Filed: Dec. 1, 2005

(65) Prior Publication Data

US 2006/0125536 A1 Jun. 15, 2006

(30) Foreign Application Priority Data

Dec. 11, 2004 (KR) ...................... 10-2004-0104633

(51) Int. Cl.
*H03L 7/06* (2006.01)
(52) U.S. Cl. ...................... 327/156; 327/157; 327/147
(58) Field of Classification Search ................ 327/156, 327/157, 147, 148; 331/1 A, 17; 375/375–376
See application file for complete search history.

(56) References Cited

U.S. PATENT DOCUMENTS

| | | | |
|---|---|---|---|
| 6,049,254 A * | 4/2000 | Knapp et al. .................. 331/16 |
| 6,232,813 B1 | 5/2001 | Lee |
| 6,329,854 B1 | 12/2001 | Lee et al. |
| 6,373,913 B1 | 4/2002 | Lee |
| 6,812,756 B2 * | 11/2004 | Starr .......................... 327/157 |
| 6,853,254 B2 | 2/2005 | Li |
| 6,867,627 B1 | 3/2005 | Murtagh |
| 6,894,572 B2 | 5/2005 | Sumi et al. |
| 6,956,922 B2 * | 10/2005 | Weldon et al. .............. 375/373 |
| 2004/0178834 A1 | 9/2004 | Lee |

FOREIGN PATENT DOCUMENTS

JP 02246423 A * 10/1990

(Continued)

OTHER PUBLICATIONS

Notice to Submit Response, Korean Application No. 10-2004-0104633, May 25, 2006.

*Primary Examiner*—Quan Tra
*Assistant Examiner*—Rey Aranda
(74) *Attorney, Agent, or Firm*—Myers Bigel Sibley & Sajovec, P.A.

(57) ABSTRACT

A phase locked loop (PLL) circuit having a deadlock protection circuit and a deadlock protection method of the PLL circuit are provided. The PLL circuit includes: a phase frequency detector, which receives an input clock signal and a divided clock signal and compares the phase and frequency of the input clock signal with the phase and frequency of the divided clock signal; a charge pump, which receives an output signal of the phase frequency detector; a voltage-controlled oscillator, which oscillates in response to an output voltage of the charge pump; a main divider, which divides the frequency of an first output clock signal of the voltage-controlled oscillator and outputs the divided clock signal as the division result; and a deadlock protection circuit, which is electrically coupled to an output port of the voltage-controlled oscillator and an input port of the main divider, and divides the frequency of the first output clock signal of the voltage-controlled oscillator and then provides the division result to the main divider if the frequency of the first output clock signal of the voltage-controlled oscillator is above a threshold frequency.

3 Claims, 2 Drawing Sheets

| | FOREIGN PATENT DOCUMENTS | | KR | 1998-51635 | 9/1998 |
|---|---|---|---|---|---|
| JP | 10-173520 | 6/1998 | KR | 1999-84922 | 12/1999 |
| JP | 11-103249 | 4/1999 | * cited by examiner | | |

PHASE LOCKED LOOP CIRCUIT HAVING DEADLOCK PROTECTION CIRCUIT AND METHODS OF OPERATING SAME

BACKGROUND OF THE INVENTION

This application claims priority to Korean Patent Application No. 2004-104633, filed Dec. 11, 2004, the disclosure of which is hereby incorporated herein by reference.

1. Field of the Invention

The present invention relates to integrated circuit devices, and more particularly, to phase locked loop integrated circuits.

2. Description of the Related Art

Phase locked loop (PLL) circuits are widely used in semiconductor integrated circuits, such as application specific integrated circuits, system-on-chips, or memory devices. PLL circuits perform various operations such as frequency synthesis, frequency multiplication, and clock recovery. FIG. 1 is a block diagram of a conventional PLL circuit. This conventional PLL circuit includes a phase frequency detector 11, a charge pump 12, a loop filter 13, a voltage-controlled oscillator 14, and a main divider 15. The phase frequency detector 11 receives an input clock signal IN and compares the phase and frequency of the input clock signal IN with the phase and frequency of a divided clock signal DIN received from the main divider 15. The charge pump 12 receives an output signal of the phase frequency detector 11, and the voltage-controlled oscillator 14 oscillates in response to an output voltage of the charge pump 12. The main divider 15 divides the frequency of a first output clock signal OUT of the voltage-controlled oscillator 14 and outputs the divided clock signal DIN. These and other aspects of the PLL of FIG. 1 are more fully illustrated and described in section 9.5.2 of a textbook by Jan M. Rabaey, entitled Digital Integrated Circuits: A Design Perspective, Prentice-Hall, ISBN 0-13-178609-1, pp. 540-542.

Ideally, a conventional PLL circuit may continuously perform a looping operation until the PLL is locked to a desired frequency. However, if the frequency of the first output clock signal OUT of the voltage-controlled oscillator 14 is above a threshold frequency, the main divider 14 may not be able to perform its operation sufficiently, and thus, a deadlock condition, which is a phenomenon related to poor locking of the conventional PLL circuit, may occur.

SUMMARY OF THE INVENTION

The present invention provides a phase locked loop (PLL) circuit having a deadlock protection circuit therein. The present invention also provides a deadlock protection method of a PLL circuit.

According to an embodiment of the present invention, there is provided a phase locked loop (PLL) circuit. The PLL circuit includes a phase frequency detector, which receives an input clock signal and a divided clock signal and compares the phase and frequency of the input clock signal with the phase and frequency of the divided clock signal, a charge pump, which receives an output signal of the phase frequency detector, a voltage-controlled oscillator, which oscillates in response to an output voltage of the charge pump, a main divider, which divides the frequency of an first output clock signal of the voltage-controlled oscillator and outputs the divided clock signal as the division result, and a deadlock protection circuit. The deadlock protection circuit, which is electrically coupled to an output port of the voltage-controlled oscillator and an input port of the main divider, divides the frequency of the first output clock signal of the voltage-controlled oscillator and then provides the division result to the main divider if the frequency of the first output clock signal of the voltage-controlled oscillator is above a threshold frequency.

The deadlock protection circuit may include a sub-divider, which divides the frequency of the first output clock signal of the voltage-controlled oscillator and a comparator, which compares the output voltage of the charge pump with a reference voltage, outputs a selection signal with a first logic value if the output voltage of the charge pump is lower than the reference voltage, and outputs the selection signal with a second logic value if the output voltage of the charge pump is higher than the reference voltage. A selector is also provided. The selector provides the first output clock signal of the voltage-controlled oscillator to the main divider if the selection signal generated by the comparator is the first logic value and provides an output signal of the sub-divider to the main divider if the selection signal generated by the comparator is the second logic value.

According to another embodiment of the present invention, there is provided a PLL circuit. The PLL circuit includes a phase frequency detector, which receives an input clock signal and a divided clock signal and compares the phase and frequency of the input clock signal with the phase and frequency of the divided clock signal. A charge pump is also provided. This charge pump receives an output signal of the phase frequency detector. A voltage-controlled oscillator, which oscillates in response to an output voltage of the charge pump, is also provided along with a deadlock protection circuit. The deadlock protection circuit compares an output voltage of the charge pump with a reference voltage, outputs a first output clock signal of the voltage-controlled oscillator if the output voltage of the charge pump is lower than the reference voltage, divides the frequency of the first output clock signal of the voltage-controlled oscillator and then outputs the division result if the output voltage of the charge pump is higher than the reference voltage. A main divider is also provided that divides the frequency of an output signal of the deadlock protection circuit and outputs the divided clock signal as the division result.

The deadlock protection circuit may include a sub-divider, which divides the frequency of the first output clock signal of the voltage-controlled oscillator and a comparator, which compares the output voltage of the charge pump with the reference voltage, outputs a first logic value if the output voltage of the charge pump is lower than the reference voltage, and outputs a second logic value if the output voltage of the charge pump is higher than the reference voltage. A selector is also provided. The selector provides the first output clock signal of the voltage-controlled oscillator to the main divider if the comparator outputs the first logic value and provides an output signal of the sub-divider to the main divider if the comparator outputs the second logic value.

According to another embodiment of the present invention, there is provided a deadlock protection method of a PLL circuit. The deadlock protection method includes dividing the frequency of the first output clock signal of the voltage-controlled oscillator and then providing the division result to the main divider if the frequency of the first output clock signal of the voltage-controlled oscillator is above a threshold frequency.

The dividing of the frequency and the providing of the division result may include dividing the frequency of the first output clock signal of the voltage-controlled oscillator comparing the output voltage of the charge pump with a reference voltage, outputting a first logic value if the output voltage of the charge pump is lower than the reference voltage, and outputting a second logic value if the output voltage of the charge pump is higher than the reference voltage. The first output clock signal of the voltage-controlled oscillator is provided to the main divider if the first logic value is output, but an output signal of the sub-divider is provided to the main divider if the second logic value is output.

According to another embodiment of the present invention, a deadlock protection method includes comparing the output voltage of the charge pump with a reference voltage, providing the first output clock signal of the voltage-controlled oscillator to the main divider if the output voltage of the charge pump is lower than the reference voltage, dividing the frequency of the first output clock signal of the voltage-controlled oscillator and then providing the division result to the main divider if the output voltage of the charge pump is higher than the reference voltage.

DETAILED DESCRIPTION OF THE INVENTION

The invention is described more fully hereinafter with reference to the accompanying drawings, in which embodiments of the invention are shown. This invention may, however, be embodied in many different forms and should not be construed as limited to the embodiments here. Rather, these embodiments are provided so that this disclosure will be thorough and complete and will fully convey the scope of the invention to those skilled in the art. Like numbers refer to like elements throughout.

Figure 1:
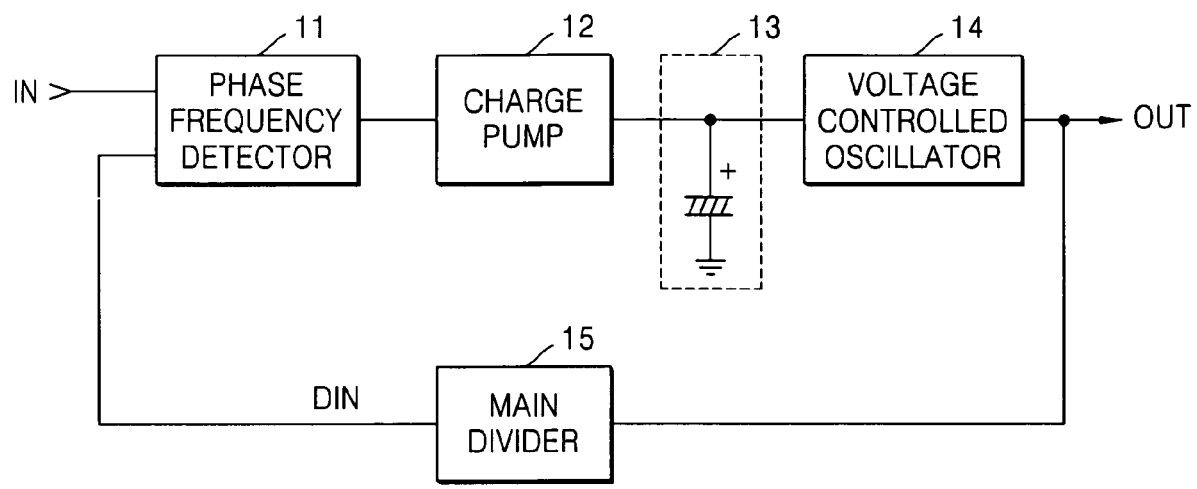
FIG. 1 is a block diagram of a conventional phase locked loop (PLL) circuit.
Figure 2:
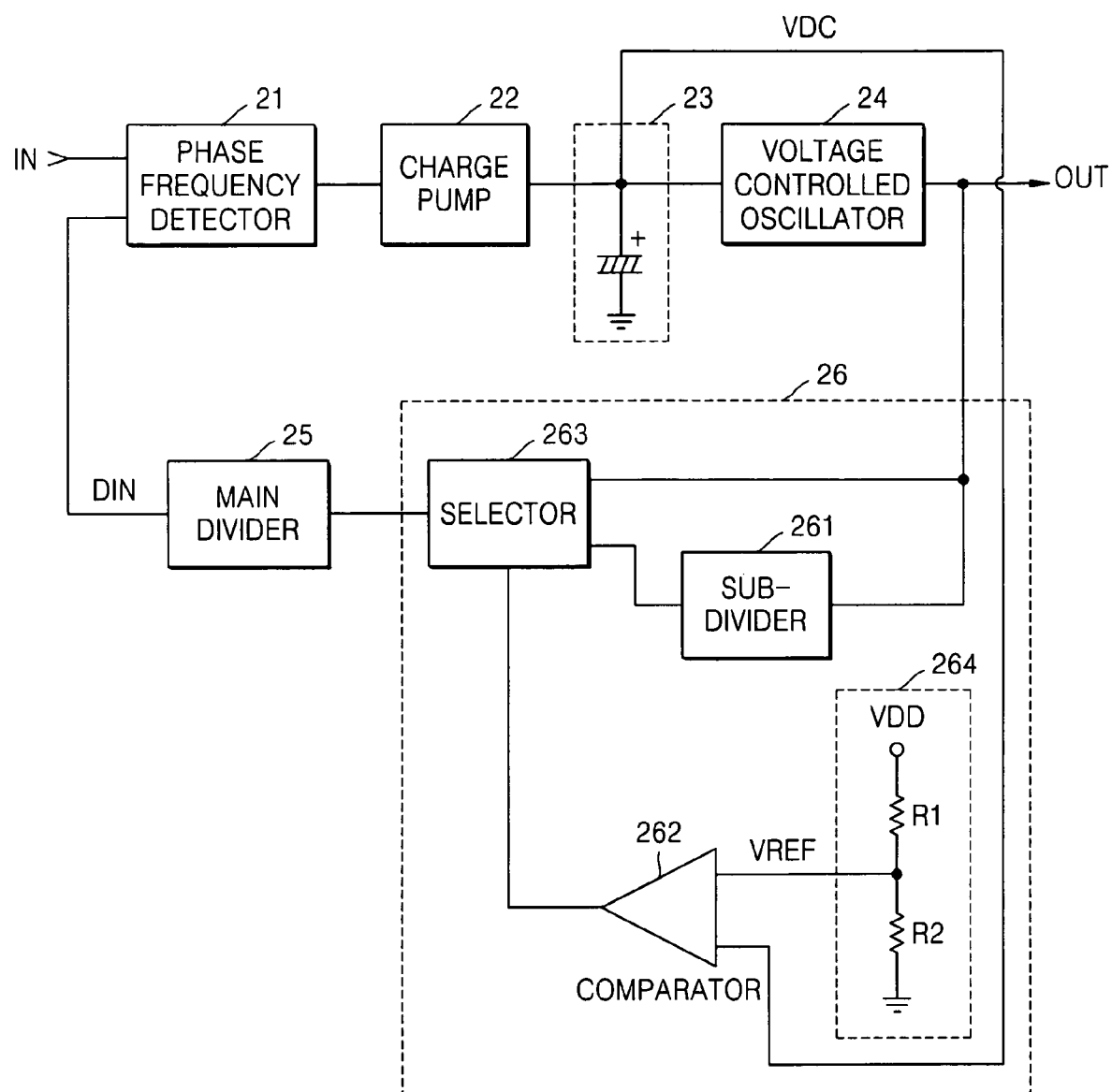
FIG. 2 is a block diagram of a PLL circuit according to some embodiments of the present invention.

FIG. 2 is a block diagram of a phase locked loop (PLL) circuit according to some embodiments of the present invention. Referring to FIG. 2, the PLL circuit includes a phase frequency detector 21, a charge pump 22, a loop filter 23, a voltage-controlled oscillator 24, a main divider 25, and a deadlock protection circuit 26. The phase frequency detector 21 receives an input clock signal IN and compares the phase and frequency of the input clock signal IN with the phase and frequency of a divided clock signal DIN received from the main divider 25. The charge pump 22 receives an output signal of the phase frequency detector 21, and the voltage-controlled oscillator 24 oscillates in response to an output direct current (DC) voltage VDC of the charge pump 22.

The deadlock protection circuit 26 is electrically coupled to an output port of the voltage-controlled oscillator 24 and an input port of the main divider 25 and performs a deadlock protection method according to some embodiments of the present invention. Specifically, the deadlock protection circuit 26 divides the frequency of a first output clock signal OUT of the voltage-controlled oscillator 24 and provides the division result to the main divider 25 if the frequency of the first output clock signal OUT of the voltage-controlled oscillator 24 is above a threshold frequency.

In other words, the deadlock protection circuit 26 compares the output DC voltage VDC of the charge pump 22 with a reference voltage VREF. If the output DC voltage VDC of the charge pump 22 is lower than the reference voltage VREF, the deadlock protection circuit 26 outputs the first output clock signal OUT of the voltage-controlled oscillator 24 without dividing the frequency of the first output clock signal OUT of the voltage-controlled oscillator 24. However, if the output DC voltage VDC of the charge pump 22 is higher than the reference voltage VREF, the deadlock protection circuit 26 divides the frequency of the first output clock signal OUT of the voltage-controlled oscillator 24 and outputs the division result to the main divider 25. Here, the reference voltage VREF is set to be closer to the level of the output DC voltage VDC of the charge pump 22 when a deadlock occurs. The output DC voltage VDC of the charge pump 22 may also be referred to as the control signal. The main divider 25 divides the frequency of an output signal of the deadlock protection circuit 26 and outputs the division result (i.e., the divided clock signal DIN), which is electrically coupled to the phase frequency detector 21.

The deadlock protection circuit 26 includes a sub-divider 261, a comparator 262, a selector 263, and a reference voltage generator 264. The sub-divider 261 divides the frequency of the first output clock signal OUT of the voltage-controlled oscillator 24 and outputs the division result. The sub-divider 261 may include a single D-flipflop, in which case, the sub-divider 261 divides the frequency of the first output clock signal OUT of the voltage-controlled oscillator by two.

The comparator 262 compares the output DC voltage VDC of the charge pump 22 with the reference voltage VREF. If the output DC voltage VDC of the charge pump 22 is lower than the reference voltage VREF, the selection signal generated by the comparator 262 is a first logic value (e.g., a logic low value). However, if the output DC voltage VDC of the charge pump 22 is higher than the reference voltage VREF, the selection signal generated by the comparator 262 is a second logic value (e.g., a logic high value).

If the selection signal generated by the comparator 262 is the first logic value, the selector 263 provides the main divider 25 with the first output clock signal OUT of the voltage-controlled oscillator 24. However, if the selection signal generated by the comparator 262 is the second logic value, the selector 263 provides the main divider 25 with an output signal of the sub-divider 261.

In other words, if the output DC voltage VDC of the charge pump 22 is lower than the reference voltage VREF (i.e., if the frequency of the first output clock signal OUT of the voltage-controlled oscillator 24 is not higher than a threshold frequency), the first output clock signal OUT of the voltage-controlled oscillator 24 is provided to the main divider 25 via the selector 263. However, if the output DC voltage VDC of the charge pump 22 is higher than the reference voltage VREF (i.e., if the frequency of the first output clock signal OUT of the voltage-controlled oscillator 24 is higher than the threshold frequency), the divided clock signal, which is obtained by dividing the frequency of the first output clock signal OUT of the voltage-controlled oscillator 24 using the sub-divider 261, is provided to the main divider 25 via the selector 263. The threshold frequency is the highest frequency at which the main divider 25 can operate. The reference voltage generator includes a voltage divider 264, which includes resistors R1 and R2 and generates the reference voltage VREF. As described above, the reference voltage VREF is set to be close to the level of the output DC voltage VDC of the charge pump 22 when a deadlock condition occurs.

In short, in the PLL circuit according to some embodiments of the present invention the deadlock protection circuit 26 divides the frequency of the first output clock signal OUT of the voltage-controlled oscillator 24 by at least two, thereby obtaining the divided clock signal DIN. Thereafter, the deadlock protection circuit 26 provides the divided clock signal DIN to the main divider 25. Accordingly, the main divider 25 can normally perform its operation, and thus, the PLL circuit according to some embodiments of the present invention is able to come out of the deadlock. Thereafter, the PLL circuit according to some embodiments of the present invention normally operates and is locked to a desired frequency through a looping operation.

As described above, the PLL circuit according to the present invention can prevent a deadlock condition, which occurs as a result of the malfunction of a main divider when the frequency of an output signal of a voltage-controlled oscillator is higher than a threshold frequency.

Accordingly, as described above, the phase-locked loop (PLL) integrated circuit of FIG. 2 includes a phase-frequency detector 21, which is responsive to an input clock signal IN and a divided clock signal DIN, a voltage-controlled oscillator (VCO) 24 and a divide-by-N feedback circuit (25, 26). The voltage-controlled oscillator 24 is configured to generate at least a first output clock signal (shown as OUT) in response to a control signal (shown as VDC). The divide-by-N feedback circuit is configured to generate the divided clock signal DIN in response to the first output clock signal OUT. The divide-by-N feedback circuit includes a deadlock protection circuit 26. This circuit 26 is configured to increase a value of N in response to detecting an excessive value of the control signal (i.e., VDC exceeds a threshold value), where N is a positive integer greater than one. The divide-by-N feedback circuit also includes a main divider 25. The main divider 25 has an input electrically coupled to an output of the deadlock protection circuit and an output electrically coupled to an input of the phase-frequency detector 21. The deadlock protection circuit 26 includes a selector 263. The selector 263 has an output electrically coupled to the input of the main divider and a first input responsive to the first output clock signal. The deadlock protection circuit 26 also includes a sub-divider 261. This sub-divider 261 is responsive to the first output clock signal and has an output electrically coupled to a second input of the selector 263. The selector 263 is responsive to a selection signal, which is generated by a comparator 262. The sub-divider 261 is configured to divide a frequency of the first output clock signal by an integer amount greater than one.

The foregoing is illustrative of the present invention and is not to be construed as limiting thereof. Although some embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims.

What is claimed is:

1. A phase-locked loop (PLL) integrated circuit, comprising:
   a phase-frequency detector responsive to an input clock signal and a divided clock signal;
   a voltage-controlled oscillator configured to generate at least a first output clock signal in response to a control signal; and
   a divide-by-N feedback circuit configured to generate the divided clock signal in response to the first output clock signal, said divide-by-N feedback circuit comprising:
   a sub-divider having an input electrically coupled to an output of said voltage-controlled oscillator, said sub-divider configured to divide a frequency of the first output clock signal by N1, where N1 is a first integer greater than one;
   a selector having a first input electrically coupled to the output of said voltage-controlled oscillator and a second input electrically coupled to an output of the sub-divider, said selector responsive to a selection signal that controls which of the first and second inputs of said selector is electrically connected to an output of said selector;
   a main divider having an input electrically coupled to the output of said selector, said main divider configured to generate the divided clock signal by dividing a frequency of a clock signal generated at the output of selector by N2, where N2 is a second integer greater than one; and
   a comparator configured to generate the selection signal at an output thereof, said comparator having a first input electrically coupled to the output of said voltage-controlled oscillator and a second input responsive to a reference voltage.

2. The PLL of claim 1, further comprising a voltage divider having an output electrically coupled to the second input of the comparator.

3. The PLL of claim 1, further comprising a charge pump configured to generate the control signal in response to a detector output signal generated by said phase-frequency detector.

* * * * *